United States Patent
McCallister et al.

(10) Patent No.: US 6,392,500 B1
(45) Date of Patent: May 21, 2002

(54) ROTATIONALLY INVARIANT DIGITAL COMMUNICATIONS

(75) Inventors: Ronald D. McCallister; Bruce A. Cochran, both of Mesa; Bradley Paul Badke, Chandler, all of AZ (US)

(73) Assignee: Sicom, Inc., Scottsdale, AZ (US)

( * ) Notice: Subject to any disclaimer, the term of this patent is extended or adjusted under 35 U.S.C. 154(b) by 0 days.

(21) Appl. No.: 09/300,624

(22) Filed: Apr. 27, 1999

(51) Int. Cl.[7] .............................................. H03M 13/12

(52) U.S. Cl. ...................... 332/103; 375/261; 375/298; 714/786

(58) Field of Search ................... 375/307, 261, 375/298; 332/103; 714/786

(56) References Cited

U.S. PATENT DOCUMENTS

| | | | |
|---|---|---|---|
| 4,520,490 A | * 5/1985 | Wei | |
| 4,713,817 A | 12/1987 | Wei ............................. | 714/758 |
| 5,048,056 A | 9/1991 | Goldstein ..................... | 375/261 |
| 5,394,440 A | 2/1995 | Goldstein et al. ............ | 375/265 |
| 5,515,400 A | * 5/1996 | Arai ............................. | 375/261 |
| 5,535,228 A | 7/1996 | Dong et al. .................. | 714/800 |
| 5,559,561 A | 9/1996 | Wei .............................. | 348/470 |
| 6,097,764 A | * 8/2000 | McCallister et al. ......... | 375/298 |

OTHER PUBLICATIONS

C. Melvil Thomas, Michael Y. Weidner, and S.H. Durrani "Digital Amplitude–Phase Keying with M–ary Alphabets", IEEE Transactions on Communications, vol. Com–22, Feb. 2, 1974, pp168–179.

Lee–Fang wei "Generalized Square and Hexagonal Constellations for Intersymbol–Interference hannels with Generalized Tomlinson–Harashima Precoders", IEEE Transactions on Communications, vol. 42. 9, Sep. 9, 1994, pp2713–2721.

* cited by examiner

Primary Examiner—Arnold Kinkead
(74) Attorney, Agent, or Firm—Lowell W. Gresham; Jordan M. Meschkow; Meschkow & Gresham, P.L.C.

(57) ABSTRACT

A digital communications system (10) employs a rotationally invariant phase point constellation (80, 80', 80") in a modulator (12) thereof and a corresponding carrier phase acquisition phase locked loop (56, 66, 74, 76, 78) in a demodulator (14) thereof. The phase point constellation (80) is rotationally invariant and the demodulator (14) is able to achieve carrier phase synchronization due at least in part to the inclusion of phase point voids (94) positioned in the phase point constellation (80, 80', 80"). Pragmatic encoding is employed with differential encoding (28, 64) only on non-convolutionally encoded bits. The phase point constellation (80, 80', 80") provides identical codes for convolutionally encoded bits (30) of phase points (84) having equal magnitude that are rotated 90°, 180° and 270° degrees from one another. Specific constellations of 256, 64 and 16 points are disclosed.

21 Claims, 5 Drawing Sheets

ROTATIONALLY INVARIANT DIGITAL COMMUNICATIONS

TECHNICAL FIELD OF THE INVENTION

This invention relates to the field of digital communications. More specifically, the present invention relates to rotationally invariant digital communications and to phase constellation configurations that promote rotationally invariant digital communications.

BACKGROUND OF THE INVENTION

For efficient data communications, transmit power levels should be as low as possible, data rate should be as high as possible, and bit error rate should be as low as possible. In all communication systems, faster data rates and lower bit error rates are desirable. In wireless communication systems, lower power levels are particularly desirable because they permit the use of less expensive transmit amplifiers, achieve better spectral containment within an allocated frequency band and reduce battery drain in battery-powered devices. Any one or two of these three characteristics can often be improved at a cost of deteriorating the remaining characteristic(s) without an improvement in basic communication efficiency. However, an improvement in the basic communication efficiency is needed to improve one of these characteristics without causing deterioration in the others.

A phase point constellation defines the alphabet of phase states at which a digital communication signal is transmitted and assigns specific digital codes to those phase states. The phase point constellation configuration has a significant influence on basic communication efficiency. Older communication systems have used a QPSK phase constellation in which the alphabet includes only four phase points. Communication efficiency improves by using a more efficient phase point constellation. Thus, a phase point constellation with an alphabet of sixteen phase points is used in implementing the well-known and more efficient 16-QAM modulation. More modern communication systems use even higher order phase point constellations.

In a differentially coherent communication system, data is communicated through relative change in carrier phase between one unit baud interval and the next. In contrast, coherent communications communicate data through absolute carrier phase states in each unit baud interval. With differentially coherent communications, a receiver need not acquire or maintain the absolute phase reference used by the transmitter's phase point constellation in forming the digital communication signal. Unfortunately, differentially coherent communications are less efficient and may experience up to 3 dB performance degradation when compared to an otherwise equivalent coherent communication scheme because errors that occur in one unit baud interval cause additional errors in the next unit baud interval. Consequentially, coherent communication systems are often preferred because of improved efficiency, but such systems must acquire an absolute phase reference before valid data may be detected.

Once a receiver in a coherent communication system acquires an absolute carrier phase reference, a cycle slip phenomenon may cause the receiver to lose that phase reference. The cycle slip phenomenon may result from the use of inexpensive, noisy oscillators in the transmitter and/or receiver, interference, and the like. When cycle slip happens, valid data can no longer be detected, and the receiver needs to reacquire the absolute carrier phase reference before valid data can again be detected.

A non-rotationally invariant communication system endures a lengthy absolute carrier phase reference acquisition and reacquisition process. Often, this lengthy process may be tens of thousands of unit baud intervals long. Partially rotationally invariant systems must also endure a lengthy acquisition or reacquisition process for some cycle slip situations, but can quickly resolve the proper carrier phase reference for other cycle slip situations. When the cycle slip phenomenon occurs more often than rarely, this reacquisition time may be undesirably long for non-rotationally invariant and partially rotationally invariant communication systems.

In contrast to non-rotationally invariant and partially rotationally invariant communication systems, fully rotationally invariant (FRI) systems can quickly resolve proper phase rotation (i.e. acquire the carrier phase reference) for all cycle slip situations within a few baud intervals. Unfortunately, conventional FRI communication systems are undesirably complicated, inefficient, or useable only with lower order modulations. For example, conventional FRI communication systems require the insertion of parity or pilot bits that are checked on frame boundaries in the receiver to resolve phase ambiguities. Such systems undesirably complicate the hardware by requiring time-framing circuits along with parity or pilot bit insertion, extraction and checking circuits. Such systems also experience inefficiency by dedicating communication capacity to overhead parity and pilot bits that could otherwise be applied to user data.

Other conventional FRI systems achieve full rotational invariance by adopting an excessively inefficient phase constellation. For example, conventional 16-QAM is not a rotationally invariant scheme, but can be altered into a rotationally invariant scheme by moving each quadrant's phase points diagonally away from the phase point constellation origin. Unfortunately, this technique results in a communication scheme that can be even less efficient than differentially coherent 16-QAM communication, and the efficiency deteriorates as this technique is applied to larger modulation orders. Still other systems adopt phase constellations that lead to basic communication inefficiency when adapted for use with wireless communication links.

Still other FRI systems, while carrier phase coherent, rely on differential data encoding for all communicated bits. Differential data encoding, particularly when applied to all communicated bits, is undesirable for the same reason that differentially coherent carrier phase communications is undesirable. Namely, with differential data encoding, bit errors occur in pairs of unit intervals causing a deterioration in basic communication efficiency.

SUMMARY OF THE INVENTION

Accordingly, it is an advantage of the present invention that an improved rotationally invariant digital communication system and method are provided.

Another advantage is that an improved digital communication system and method achieve full rotational invariance even for higher modulation orders.

Another advantage is that rotational invariance is achieved at a cost of only a small decrease in basic communication efficiency.

Another advantage is that rotational invariance is achieved using a phase point constellation that is suitable for wireless communication.

Another advantage is that rotational invariance is achieved without requiring differential encoding on at least a portion of the communicated bits.

The above and other advantages of the present invention are carried out in one form by a data modulator used in a digital communications system. The data modulator includes phase map inputs for receiving at least four bits per unit baud interval. Phase map outputs provide a set of coordinates of a two-dimensional phase space during each unit baud interval. A phase mapping circuit is coupled between said inputs and said outputs. The phase mapping circuit is configured to implement a phase point constellation having an origin and having phase points collinearly arranged along four diameters of the phase point constellation. A first two of these four diameters intersect at substantially 90°, and a second two of these four diameters intersect at substantially 90°. The first two diameters are rotated relative to said second two diameters at substantially 45°, and the first two diameters have fewer phase points than the second two diameters.

The above and other advantages of the present invention are carried out in another form by a method for rotationally invariant communication in a digital communication system. The method calls for receiving a digital communication signal configured in accordance with a phase space having a constellation of at least sixteen phase points, each of which is addressed by at least two differentially encoded bits and two convolutionally encoded bits. For each of the phase points, there exists located at substantially the same magnitude as the phase point and rotated approximately 90° in the phase constellation from the phase point, another phase point having an equal data value for the two convolutionally encoded bits. In response to the digital communication signal, phase error estimates relative to the constellation of at least sixteen phase points are generated. The phase space is masked into an enabled portion and a disabled portion. A phase locked loop is driven with phase error estimates obtained from the enabled portion of the phase space.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
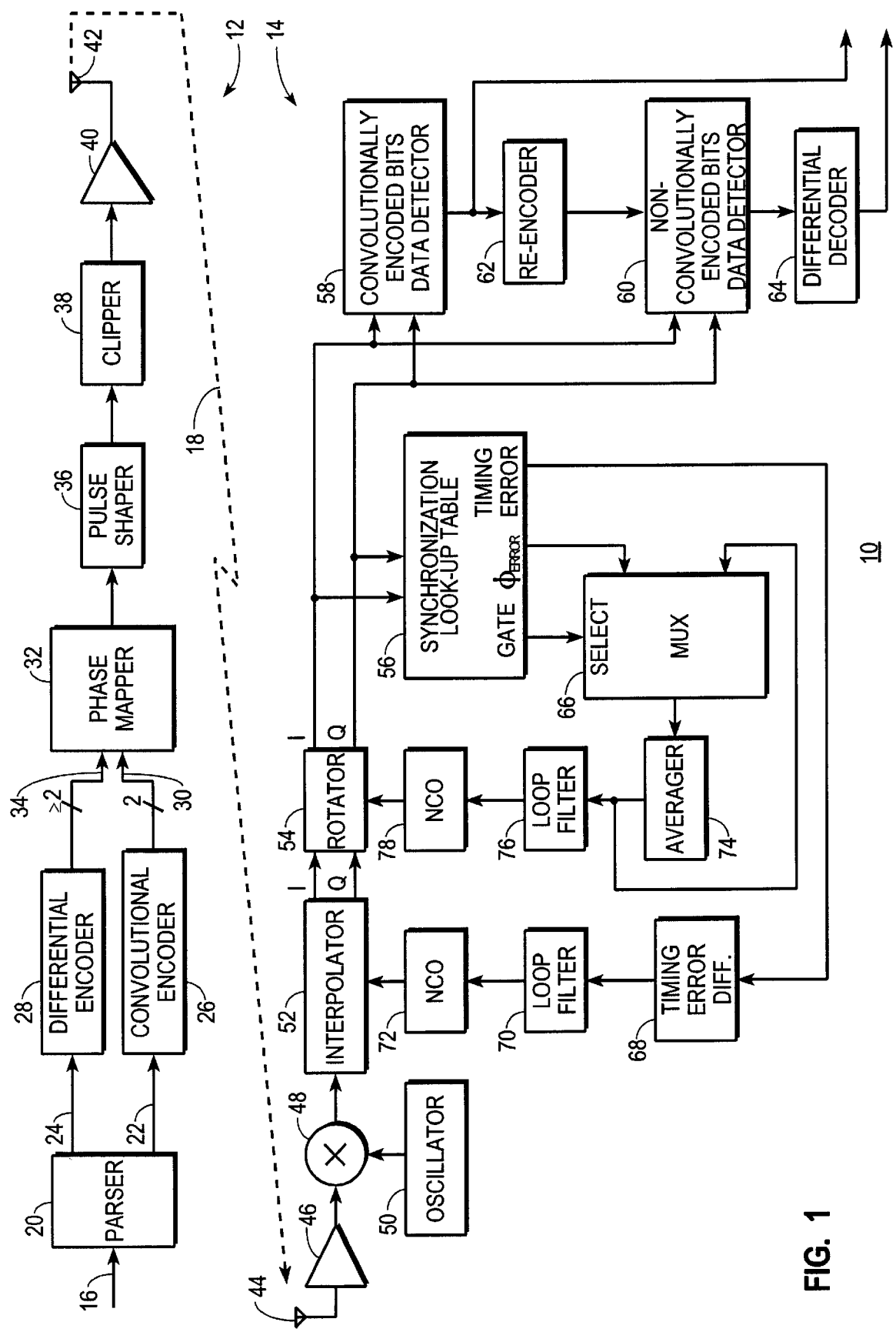
FIG. 1 shows a block diagram of a digital communication system configured in accordance with a preferred embodiment of the present invention.

FIG. 1 shows a block diagram of a digital communication system 10 configured in accordance with a preferred embodiment of the present invention. Communication system 10 includes a modulator 12 and a demodulator 14. Modulator 12 accepts digital data at an input 16 and transmits a digital communication signal conveying this digital data via a communication link 18. In the preferred embodiment, communication link 18 is a wireless communication link. Demodulator 14 receives this digital communication signal from communication link 18 and extracts from it the digital data originally accepted at input 16 of modulator 12. While the preferred embodiment is configured for RF, wireless communications, those skilled in the art will appreciate that this is not a requirement and that wire, fiber optic, wide-band cable, and communication systems with other types of transmission media may also benefit from the present invention.

The digital data accepted at input 16 of modulator 12 are user data, and these data may or may not be encoded. For example, such data may be block encoded and interleaved in accordance with Reed-Solomon or other block encoding techniques so that a concatenated encoding scheme is provided by communication system 10. In a concatenated encoding scheme, modulator 12 and demodulator 14 illustrated in FIG. 1 implement an inner coding scheme which delivers a predetermined bit error rate to an outer encoding scheme implemented through block encoding.

In the preferred embodiment, communication system 10 employs pragmatic encoding. In other words, each symbol modulated by modulator 12 conveys information describing some bits that have been convolutionally encoded and describing some bits that have not been convolutionally encoded. Accordingly, input 16 supplies the user data to a parser 20, which parses the user data into first and second data streams 22 and 24, respectively. First data stream 22 passes to an input of a convolutional encoder 26, and second data stream 22 passes to an input of a differential encoder 28. An output of convolutional encoder 26 provides a convolutional encoded stream of data and serves as first inputs 30 to a phase mapper 32. An output of differential encoder 28 provides a differentially encoded stream of data and serves as second inputs 34 to phase mapper 32.

In the preferred embodiment, encoder 26 is a transparent, recursive, K=7, rate 1/2 convolutional ("Viterbi") encoder. Encoder 26 may implement either a systematic or non-systematic code. Since encoder 26 implements a rate 1/2 code, two convolutionally encoded, to-be communicated bits are produced for each bit of data obtained from first data stream 22. In the preferred embodiment, exactly two coded bits are applied at phase mapper inputs 30 per unit baud interval. Although not shown, puncturing may be employed in modulator 12, and puncturing may be implemented by inserting a puncturing circuit between encoder 26 and phase mapper inputs 30. Accordingly, first data stream 22 supplies one bit of data to encoder 26 per unit baud interval if puncturing is not employed and more than one bit of data to encoder 26 per unit baud interval if puncturing is employed.

Phase mapper inputs 30 and 34 collectively provide N bits of data to phase mapper 32 per unit interval, where N is an integer number greater than or equal to four and specifically equals four, six or eight in the preferred embodiments described herein. Since exactly two coded bits are applied to phase mapper 32 at phase mapper inputs 30 per unit baud interval, N–2 bits of data are applied at phase mapper inputs 34 per unit baud interval.

Differential encoder 28 generates an output which represents the difference between the N–2 information bits being processed during a current unit baud interval and the N–2 information bits processed in an immediately preceding unit baud interval. This difference is expressed using N–2, differentially encoded, to-be communicated bits per unit baud interval.

Phase mapper 32 implements an amplitude phase shift keyed (APSK) phase point constellation arranged as discussed below. Phase mapper 32 is desirably implemented as a random access memory (RAM) in which first and second phase mapper inputs 30 and 34 represent memory address inputs. Thus, each mapping operation is performed by table look-up.

In the preferred embodiment, phase mapper 32 is configured to concurrently map exactly two convolutionally encoded bits from first phase mapper inputs 30 with N−2 differentially encoded bits from second phase mapper inputs 34. One mapping occurs for each unit baud interval. Each mapping causes a phase point to be produced. The produced phase point is obtained from an alphabet of $2^N$ phase points. Each phase point is characterized by quadrature components which exhibit a predetermined relative magnitude and phase. During each unit baud interval, a single phase point is processed through modulator 12 and a single phase point is conveyed to demodulator 14. However, the inevitable presence of noise, transmitter distortions, receiver distortions, and other factors invariably causes demodulator 14 to recover a somewhat different phase point than was transmitted. This recovered and different phase point is called a phase point estimate herein to distinguish it from the phase point generated in modulator 12. The arrangement of phase points in a phase point constellation has a significant influence on the ability of a demodulator to successfully and efficiently recover communicated data. Arrangements of phase points and phase point constellations in accordance with the present invention are discussed in more detail below.

An output of phase mapper 32 couples to an input of a pulse shaper 36, and an output of pulse shaper 36 couples to an input of a clipper 38. Pulse shaper 36 desirably implements a raised cosine, Nyquist, root Nyquist or other suitable pulse shaping filter. In wireless communications, pulse shaper 36 is desirable because it spreads the energy of each unit baud interval's phase point pulse over a number of unit baud intervals in a manner that permits recovery in demodulator 14. This spreading of the pulse in time reduces the frequency spectrum required to transmit the pulse, thereby allowing communication link 18 to occupy a reduced frequency band and further allowing many such links 18 to share a given frequency spectrum.

A consequence of the operation of pulse shaper 36 is that occasional inter-unit-baud-interval excursions of the pulse-shaped digital communication signal can exhibit a magnitude much greater than the magnitude of any phase point in the phase point constellation implemented in phase mapper 32. Accordingly clipper 38 is provided to limit those inter-unit-baud-interval excursions of the clipped, pulse-shaped digital communication signal so that the bulk of the transmission power capacity of modulator 12 can be applied to transmitting phase points rather than mere inter-unit-baud-interval excursions.

Desirably, clipper 38 operates in a way that does not significantly expand the spectral content of the signal it is processing. Accordingly, a consequence of operating clipper 38 is that transmitted phase points may occasionally be slightly distorted by the clipping function. The phase points most likely to occasionally experience such distortion are those phase points which exhibit the greatest magnitude in the phase point constellation implemented in phase mapper 32. Of course, any phase point in a phase point constellation is likely to experience some distortion due to noise, interference, and the like. Such distortions, whether from the clipping function, noise or interference, are compensated through coding gain and other communication system design parameters known to those skilled in the art. While pulse shaper 36 and clipper 38 are desirable for use in an RF digital communication application, those skilled in the art will appreciate that they are not absolutely necessary for the purposes of the present invention.

An output of clipper 38 couples to an input of a transmitter 40 portion of modulator 12. Transmitter 40 includes digital-to-analog conversion circuits, up-conversion mixers and a final amplification stage. An output from transmitter 40 couples to an antenna 42, which drives wireless communication link 18.

Demodulator 14 receives wireless communication link 18 at an antenna 44 which couples to an RF amplification and conditioning section 46. The digital communication signal received at antenna 44 is down converted at a mixer 48 to which an oscillator 50 couples in the digital implementation of a digital communication receiver depicted in FIG. 1. An output of mixer 48 couples, through conditioning and conversion circuits (not shown) well known in the art, to an input of an interpolator 52. Interpolator 52 provides complex, orthogonal signals, labeled as "I" and "Q" in FIG. 1, to a complex phase rotator 54. An output of rotator 54 provides the above-discussed recovered phase point estimates and couples to a synchronization look-up table 56, a convolutionally encoded-bits data detector 58 and a non-convolutionally encoded bits data detector 60.

Detector 58 detects convolutionally encoded bits presented at phase mapper inputs 30 for corresponding unit baud intervals in modulator 12. Detector 58 includes well known circuits such as branch metrics, a convolutional decoder, and erasure insertion if a punctured code is being implemented. An output of detector 58 provides a first portion of the recovered data and also couples to a re-encoder 62. Re-encoder 62 is desirably configured identically to convolutional encoder 26 from modulator 12.

Re-encoder 62 has an output that couples to detector 60. In a manner known to those skilled in the art, detector 60 recovers the differentially encoded bits presented at phase mapper inputs 34 for corresponding unit baud intervals in modulator 12. Detector 60 may include delay circuits and a memory configured as a look-up table. Address inputs to such a memory may be provided by the appropriately delayed phase point estimates and by the re-convolutionally encoded bits obtained from re-encoder 62. An output of detector 60 couples to an input of a differential decoder 64. Differential decoder 64 performs the complementary function to differential encoder 28 in modulator 14 to decode the differentially coded bits. The output of differential decoder 64, when combined with appropriately delayed (not shown) outputs from detector 58 provide data recovered from the digital communication signal received from communication link 18. These outputs may be passed to block decoding circuits in a concatenated coding application.

Synchronization look-up table 56 generates three different outputs in response to the segment of phase space indicated by the phase point estimate received for each unit baud interval. A first output provides a gate signal and couples to a select input of a multiplexer 66 (MUX), a second output provides a phase error signal ($\phi_{ERROR}$) and couples to a first data input of multiplexer 66, and a third output provides a timing error signal and couples through a timing error differencing circuit 68 to a loop filter 70. An output of loop filter 70 couples to an input of a numerically controlled oscillator (NCO) 72, an output of which couples to a control input of interpolator 52. An output of multiplexer 66 couples to an averaging circuit 74, and an output of averaging circuit 74 couples to a loop filter 76 and to a second data input of multiplexer 66. An output of loop filter 76 couples to an input of an NCO 78, an output of which couples to phase rotator 54.

The timing error output of look-up table 56 provides a data-directed carrier timing error signal, and the change in this signal over a unit baud interval is detected in differencing circuit 68, filtered in loop filter 70 and converted to the frequency in NCO 72. Accordingly, the timing error output drives a phase locked loop that acquires and locks to the carrier frequency.

The phase error signal output from look-up table 56 drives another phase locked loop that acquires and locks to the carrier phase. This carrier phase acquisition phase locked loop includes look-up table 56, multiplexer 66, averaging circuit 74, loop filter 76 and NCO 78. The phase error expressed at the phase error output of look-up table 56 indicates the difference between the phase of the recovered phase point estimate and the closest phase point to that phase point estimate. Accordingly, the phase error signal is responsive to the phase point estimate and to the configuration of the phase point constellation implemented in phase mapper 32 of modulator 12.

Generally, the carrier phase acquisition phase locked loop is responsive to only the phase errors of a portion of the phase point estimates. That portion is selected by the gate output signal from look-up table 56. As discussed in more detail below, look-up table 56 is programmed to define a phase space mask that indicates this portion of the phase point estimates. This phase space mask is configured so that a desirable S-curve for the carrier phase acquisition phase locked loop results. The loop can quickly lock to an appropriate phase state and will not lock to an inappropriate phase state.

Demodulator 14 refrains from driving the carrier phase acquisition phase locked loop in response to phase error estimates obtained from sections of the phase space disabled or masked out by the gate output from look-up table 56. When phase error estimates from such sections of the phase space are encountered, the average phase point error estimate over a predetermined number of previous unit baud intervals is used to drive the carrier phase acquisition phase locked loop.

Although not shown, those skilled in the art will appreciate that a controller is desirably included with appropriate data bus communication to the various memory and look-up devices discussed above, such as phase mapper 32, look-up table 56 and detector 60, so that these devices may be programmed with data appropriate for the application.

Figure 2:
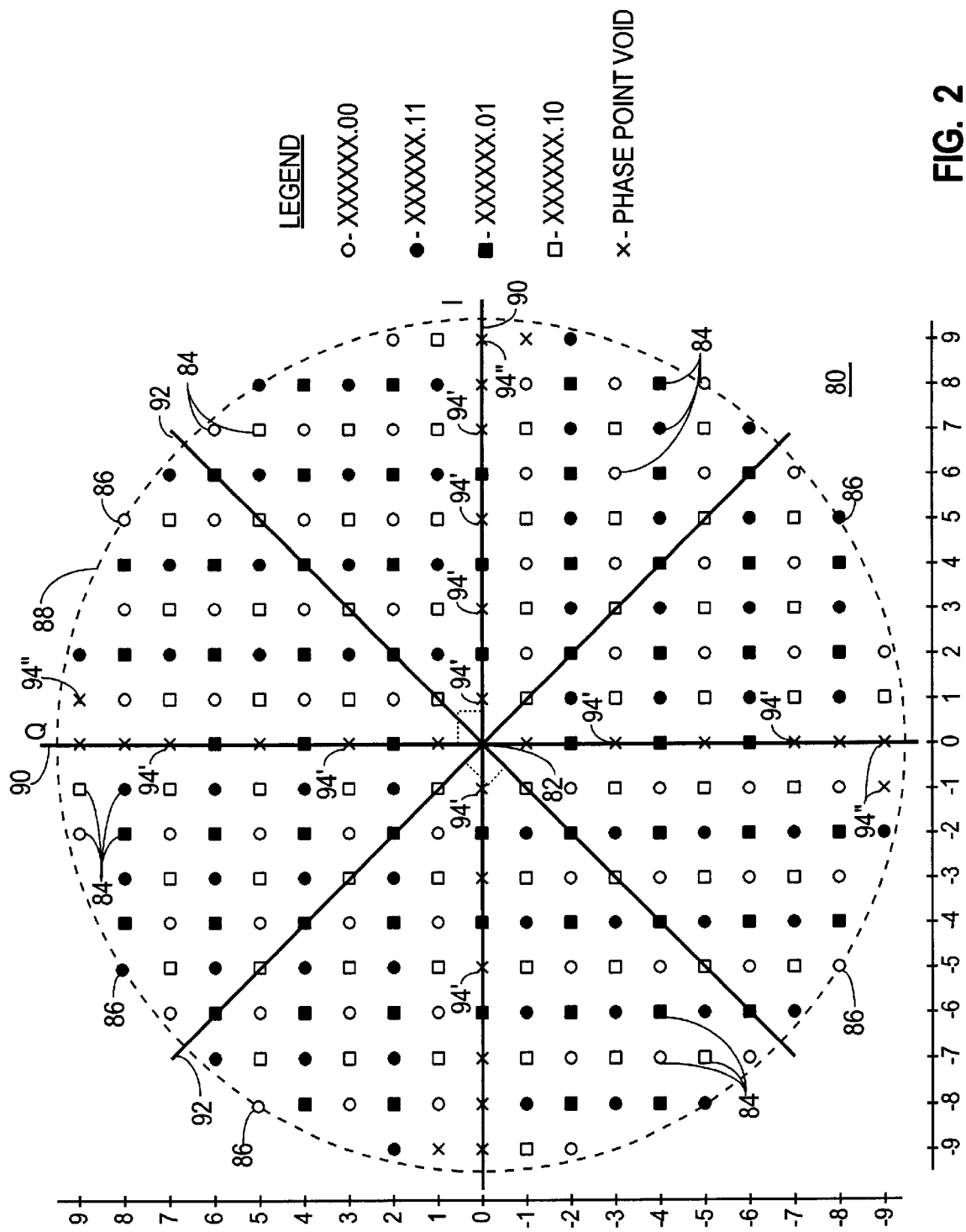
FIGS. 2–4 respectively show graphical representations of a 256-point phase constellation, a 64-point phase constellation and a 16-point phase constellation implemented by a modulator phase mapper in preferred embodiments of the present invention.
Figure 3:
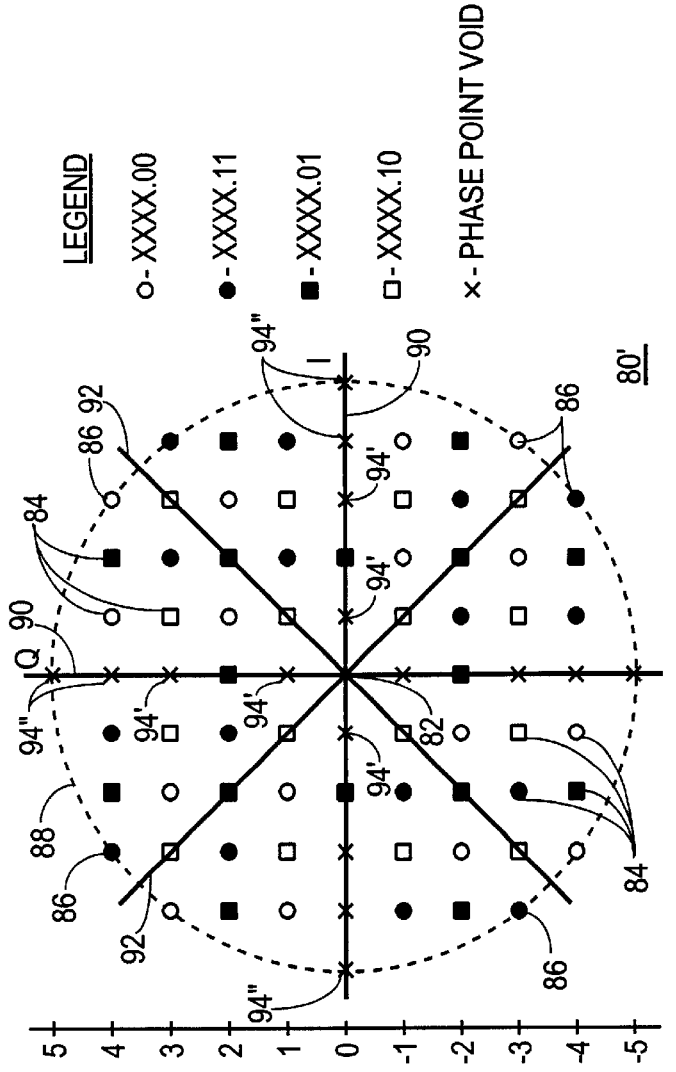
Figure 4:
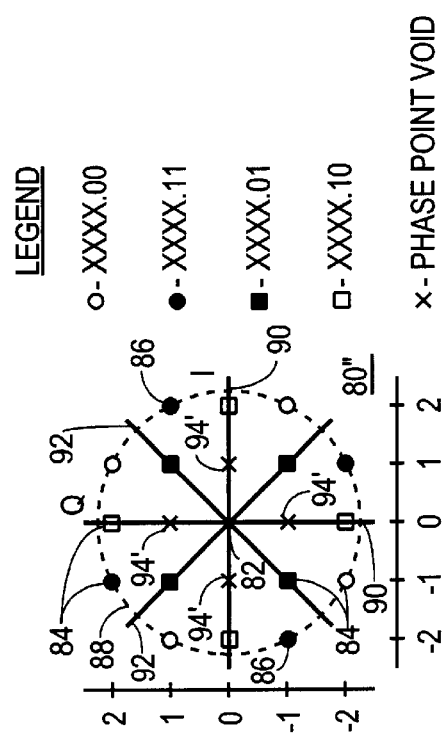

FIGS. 2–4 respectively show graphical representations of a 256-point phase constellation 80, a 64-point phase constellation 80' and a 16-point phase constellation 80" implemented by phase mapper 32 (FIG. 1) in preferred embodiments of the present invention. Constellations 80, 80' and 80" are collectively referred to as constellations 80 below. Referring to FIGS. 2–4, constellations 80 define a two-dimensional phase space, where those two dimensions are represented by in phase (I) and quadrature (Q) axes. The I and Q axes intersect at 90° at an origin 82. Origin 82 has I,Q coordinates of 0,0. Constellations 80 each have $2^N$ phase points 84, with N equal to eight in 256-point constellation 80, N equal to six in 64-point constellation 80' and N equal to four in 16-point constellation 80".

The $2^N$ phase points 84 of constellations 80 are grouped into four groups of phase points, wherein each group has $2^{(N-2)}$ phase points. Within each group of phase points 84, every phase point 84 has the same data value for phase mapped inputs 30 (FIG. 1). The phase points 84 of each given group experience all possible combinations of data values for phase mapped inputs 34 (FIG. 1). As indicated in the Legends presented in FIGS. 2–4 by the two bits to the right of the radix points, all phase points 84 for which phase mapped inputs 30 are "00" are represented by an open circle; all phase points 84 for which phase mapped inputs 30 are "11" with a filled circle; all phase points 84 for which phase mapped inputs 30 are "01" with a filled square; and, all phase points 84 for which phase mapped inputs 30 are "10" with an open square.

Phase points 86 furthest in magnitude from origin 82 reside on a circle 88, illustrated in dotted lines in FIGS. 2–4. The I and Q axes represent a first pair of orthogonal diameters 90 of phase constellations 80 relative to circle 88. A second pair of diameters 92 are substantially perpendicular to one another and are rotated substantially 45° from first pair of diameters 90. Phase points 84 are positioned on first and second pairs of diameters 90 and 92. However, a greater number of phase points are positioned on second pair of diameters 92 than on first pair of diameters 90.

In particular, phase points 84 are positioned on an I,Q grid to meet point-placement guidelines in such a manner that the magnitude of greatest magnitude phase points 86 is as small as practical. This results in a phase constellation 80 that is compatible with efficient digital communications.

In accordance with the point-placement guidelines, the minimum distance between any two points 84 is a normalized distance of one unit. As illustrated in FIGS. 2–4, many of phase points 84 reside one unit distance from other phase points 84, but desirably no phase point 84 resides less than one unit distance from another phase point 84. This guideline distributes phase points 84 more or less equally over the phase space, and in large part is responsible for the performance achieved in detecting convolutionally encoded bits.

A related guideline followed by constellations 80 is that phase points 84 which are the minimum distance apart have a hamming distance of one in the convolutionally coded phase mapper inputs 30. In other words, phase points 84 for which phase inputs 30 are coded to differ by only one bit may reside the minimum distance of one unit apart. However, phase points 84 for which phase inputs 30 are mutually inverse (i.e. have a hamming distance of two) reside no less than a distance of 1.4 units apart.

Demodulation errors are more likely to occur when phase points that are closer to one another are confused with one another during detection. By limiting the phase points 84 located the minimum distance of one unit to having a hamming distance of one, the most likely errors tend to be one bit errors, which are more easily correctable through convolutional coding. Two bit errors, which would result from confusing phase points a hamming distance of two apart, are less likely because such points are further apart.

Another guideline followed by constellations 80 is that phase points 84 having equal data values for convolutionally coded phase mapper inputs 30 are distributed more or less equally over the phase space. In particular, the minimum spacing for phase points 84 having equal data values for phase mapper inputs 30 is approximately two units. This guideline plays a role in establishing the performance achieved in detecting non-convolutionally coded bits.

The above-listed guidelines are useful in achieving an efficient phase constellation, but do not necessarily promote rotational invariance. Rotational invariance is achieved through the use of phase point voids 94 in constellations 80. Phase point voids 94 are not phase points, they are simply voids in the I,Q pattern of phase points 84. In other words, phase mapper 32 does not output phase space coordinates of phase point voids in response to any combination of bits at phase mapper inputs 30 and 34. Through the selected use of phase point voids 94, the phase point pattern in each quadrant of the phase space is rotated by 90° and replicated in an adjacent quadrant without violating any of the above-listed guidelines.

Accordingly, a guideline for the placement of phase points 84 within constellations 80 that promotes rotational invariance is that for each phase point 84 there exists other phase points 84 having the same code or data value for convolutionally coded phase mapper inputs 30, located at substantially the same magnitude and rotated substantially 90°, 180° and 270° from that phase point 84. This guideline permits carrier phase synchronization in demodulator 14 to endure 90° phase ambiguity. In particular, convolutionally coded bits data detector 58 (FIG. 1) detects the same code for convolutionally coded bits regardless of whether demodulator 14 is carrier phase synchronized precisely with the constellation 80 used by modulator 12 or offset in phase at either 90°, 180° or 270°.

The resulting phase ambiguity for non-convolutionally encoded bits (i.e. those bits presented at phase mapper inputs 34) is resolved through differential encoding and decoding. However, no differential encoding and decoding are required on convolutionally encoded bits to achieve rotational invariance. The absence of differential encoding and decoding on the convolutionally encoded bits is one source of performance improvement achieved over conventional rotationally invariant digital communication systems.

Phase point voids 94' in particular are included to allow each quadrant's phase point pattern to be rotated in adjacent quadrants. Voids 94' are located on first diameters 90. Due to the presence of voids 94', first diameters 90 have fewer phase points 84 than second diameters 92, in spite of the fact that phase points 84 located on second diameters are spaced a distance of approximately 1.414 units apart and the pattern of phase points 84 and voids 94 on first diameters 90 are collectively spaced only approximately one unit apart.

Voids 94' are located less than 1.1 units from two phase points 84 that have first and second mutually inverse data codes for phase mapper inputs 30 and less than 1.5 units from two other phase points 84 that have third and fourth mutually inverse data codes for phase mapper inputs 30. Voids 94' are located at these positions because no code could be assigned at such positions without violating above-listed guidelines. While the inclusion of voids 94' reduces communication efficiency when compared to the use of a constellation that omits such voids and packs phase points more densely, their inclusion promotes rotational invariance and their numbers are small compared to the total number of phase points 84 in the constellation 80. Any decrease in efficiency is small.

In addition, other phase point voids 94" may be included in constellations 80 even though the inclusion of a phase point at such positions would not violate the above-listed guidelines. Voids 94" are small in number compared to the total number of phase points 84 included in constellation 80. Thus, any inefficiency introduced by voids 94" is small. Voids 94" are included because constellation 80 includes $2^N$ phase points 84 without phase points at voids 94"; and, the diameter of circle 88 cannot be reduced without causing some of those $2^N$ phase points to violate some of the above-listed guidelines. In other words, voids 94" are simply left over positions in the I,Q pattern of positions which meet the above-listed guidelines. In the preferred embodiments, voids 94" are located toward the outside of constellations 80 to reduce the amount of clipping function distortion collectively experienced by phase point constellations 80.

In addition to permitting phase point 84 placement within constellations 80 to meet the above-listed guidelines, voids 94 cause the resulting constellations to exhibit a more distinctive pattern of phase points than would otherwise be achieved. The use of such a distinctive pattern is useful in allowing demodulator 14 to synchronize only on any of four possible 90° phase rotations.

Accordingly, phase point constellations 80 include phase points 84 which reside at fewer than all positions less than a magnitude M that can be located substantially in accordance with the formula:

$$\sum_{I=0}^{M}\sum_{Q=0}^{M} I, Q,$$

where M is a real number responsive to the number of phase points 84 in the constellation 80 and I and Q are integers.

For 256-point constellation 80 (FIG. 2), phase points 84 for which phase map inputs 30 exhibit a code of "01" reside substantially at orthogonal I,Q coordinates of: 2,0; 2,2; 2,4; 2,6; 2,8; 4,0; 4,2; 4,4; 4,6; 4,8; 6,0; 6,2; 6,4; 6,6; 8,2; 8,4; 0,2; 0,4; 0,6; –2,2; –2,4; –2,6; –2,8; –4,2; –4,4; –4,6; –4,8; –6,2; –6,4 –6,6; –8,2; –8,4; –2,0; –2,–2; –2,–4; –2,–6; –2,–8; –4,0; –4,–2; –4,–4; –4,–6; –4,–8; –6,0; –6,–2; –6,–4; –6,–6; –8,–2; –8,–4; 0,–2; 0,–4; 0,–6; 2,–2; 2,–4; 2,–6; 2,–8; 4,–2; 4,–4; 4,–6; 4,–8; 6,–2; 6,–4; 6,–6; 8,–2; and 8,–4. Phase point voids 94" which are positioned at I,Q coordinates of 8,0 or 9,0; 0,8 or 0,9; –8,0 or –9,0; and 0,–8 or 0,–9 could be swapped with some of the phase points 84 for which phase map inputs 30 exhibit a code of "01". Phase points 84 for which phase map inputs 30 exhibit a code of "10" reside substantially at 64 of the following 68 orthogonal I,Q coordinates: 1,1; 1,3; 1,5; 1,7; 1,9; 3,1; 3,3; 3,5; 3,7; 5,1; 5,3; 5,5; 5,7; 7,1; 7,3; 7,5; 9,1; –1,1; –1,3; –1,5; –1,7; –1,9; –3,1; –3,3; –3,5; –3,7; –5,1; –5,3; –5,5; –5,7; –7,1; –7,3; –7,5; –9,1; –1,–1; –1,–3; –1,–5; –1,–7; –1,–9; –3,–1; –3,–3; –3,–5; –3,–7; –5,–1; –5,–3; –5,–5; –5, –7; –7,–1; –7,–3; –7,–5; –9,–1; 1,–1; 1,–3; 1,–5; 1,–7; 1,–9; 3,–1; 3,–3; 3,–5; 3,–7; 5,–1; 5,–5; 5,–5; 5,–7; 7,–1; 7,–3; 7,–5; and 9,–1. The four of 68 which are not used as phase points 84 serve as phase point voids 94". Phase points 84 for which phase map inputs 30 exhibit a code of "11" are positioned substantially at orthogonal I,Q coordinates of: 2,1; 2,3; 2,5; 2,7; 2,9; 4,1; 4,3; 4,5; 4,7; 6,1; 6,3; 6,5; 6,7; 8,1; 8,3; 8,5; –1,2; –1,4; –1,6; –1,8; –3,2; –3,4; –3,6; –3,8; –5,2; –5,4; –5,6; –5,8; –7,2; –7,4; –7,6; –9,2; –2,–1; –2,–3; –2,–5; –2,–7; –2,–9; –4,–1; –4,–3; –4,–5; –4,–7; –6,–1; –6,–3; –6,–5; –6,–7; –8,–1; –8,–3; –8,–5; 1,–2; 1,–4; 1,–6; 1,–8; 3,–2; 3,–4; 3,–6; 3,–8; 5,–2; 5,–4; 5,–6; 5,–8; 7,–2; 7,–4; 7,–6; and 9,–2. Phase points 84 for which phase map inputs 30 exhibit a code of "00" are positioned substantially at orthogonal I,Q coordinates of: 1,2; 1,4; 1,6; 1,8; 3,2; 3,4; 3,6; 3,8; 5,2; 5,4; 5,6; 5,8; 7,2; 7,4; 7,6; 9,2; –2,1; –2,3; –2,5; –2,7; –2,9; –4,1; –4,3; –4,5; –4,7; –6,1; –6,3; –6,5; –6,7; –8,1; –8,3; –8,5; –1,–2; –1,–4; –1,–6; –1,8; –3,–2; –3,–4; –3,–6; –3,–8; –5,–2; –5,–4; –5,–6; –5,–8; –7,–2; –7,–4; –7,–6; –9,–2; 2,–1; 2,–3; 2,–5; 2,–7; 2,–9; 4,–1; 4,–3; 4,–5; 4,–7; 6,–1; 6,–3; 6,–5; 6,–7; 8,–1; 8,–3; and 8,–5 in said phase point constellation. Phase point voids 94' reside substantially at the following I,Q coordinates: 1,0; 3,0; 5,0;

7,0; 0,1; 0,3; 0,5; 0,7; −1,0; −3,0; −5,0; −7,0; 0,−1; 0,−3; 0,−5; and 0,−7.

For 64-point constellation 80' (FIG. 3), phase points 84 for which phase map inputs 30 exhibit a code of "01" reside substantially at orthogonal I,Q coordinates of: 2,0; 2,2; 4,2; 2,4; 0,2; −2,2; −2,4, −4,2; −2,0, −2,−2; −2,−4; −4,−2; 0,−2; 2,−2; 2,−4; and 4,−2. Phase point voids 94" which are positioned at I,Q coordinates of: 4,0; 5,0; 0,4; 0,5; −4,0; −5,0; 0,−4; and 0,−5 could be swapped with some of the phase points 84 for which phase map inputs 30 exhibit a code of "01". Phase points 84 for which phase map inputs 30 exhibit a code of "10" reside substantially at sixteen of the following twenty orthogonal I,Q coordinates: 5,0; 1,1; 1,3; 3,1; 3,3; 0,5; −1,1; −1,3; −3,1; −3,3; −5,0; −1,−1; −1,−3; −3,−1; −3,−3; 0,−5; 1,−1; 1,−3; 3,−1; and 3,−3. The four of twenty coordinates which are not used as phase points 84 serve as phase point voids 94". Phase points 84 for which phase map inputs 30 exhibit a code of "11" are positioned substantially at orthogonal I,Q coordinates of: 2,1; 4,1; 2,3; 4,3; −1,2; −1,4; −3,2; −3,4; −2,−1; −2,−3; −4,−1; −4,−3; 1,−2; 1,−4; 3,−2; and 3,−4. Phase points 84 for which phase map inputs 30 exhibit a code of "00" are positioned substantially at orthogonal I,Q coordinates of: 1,2; 1,4; 3,2; 3,4; −2,1; −2,3; −4,1; −4,3; −1,−2; −1,−4; −3,−2; −3,−4; 2,−1; 2,−3; 4,−1; and 4,−3. Phase point voids 94' reside substantially at the following I,Q coordinates: 1,0; 3,0; 0,1; 0,3; −1,0; −3,0; 0,−1; and 0,−3.

For 16-point constellation 80" (FIG. 4), phase points 84 for which phase map inputs 30 exhibit a code of "01" reside substantially at orthogonal I,Q coordinates of: 2,0; 0,2; −2,0; and 0,−2. Phase points 84 for which phase map inputs 30 exhibit a code of "10" are positioned substantially at orthogonal I,Q coordinates of: 1,1; −1,1; −1,−1; and 1,−1. Phase points 84 for which phase map inputs 30 exhibit a code of "11" are positioned substantially at orthogonal I,Q coordinates of: 2,1; −1,2; −2,−1; and 1,−2. Phase points 84 for which phase map inputs 30 exhibit a code of "00" are positioned substantially at orthogonal I,Q coordinates of: 1,2; −2,1; −1,−2; and 2,−1. Phase point voids 94' reside substantially at the following I,Q coordinates: 1,0; 0,1; −1,0; and 0,−1.

Figure 6:
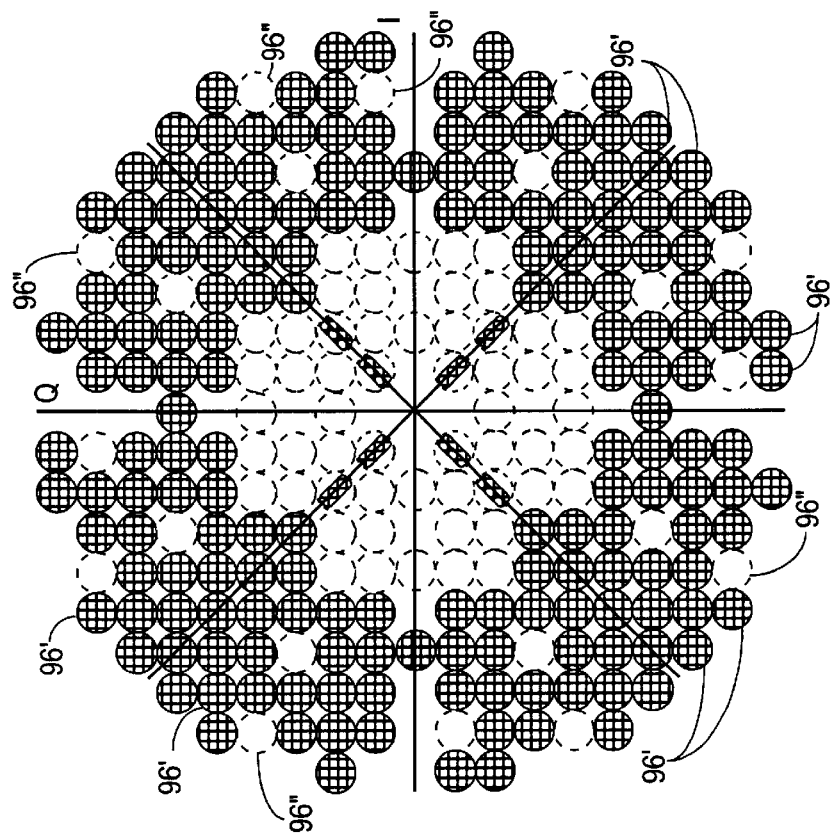
FIGS. 5 and 6 show graphical representations of alternate embodiments of synchronization masks implemented in a demodulator look-up table for the 256-point phase constellation of FIG. 2.
Figure 5:
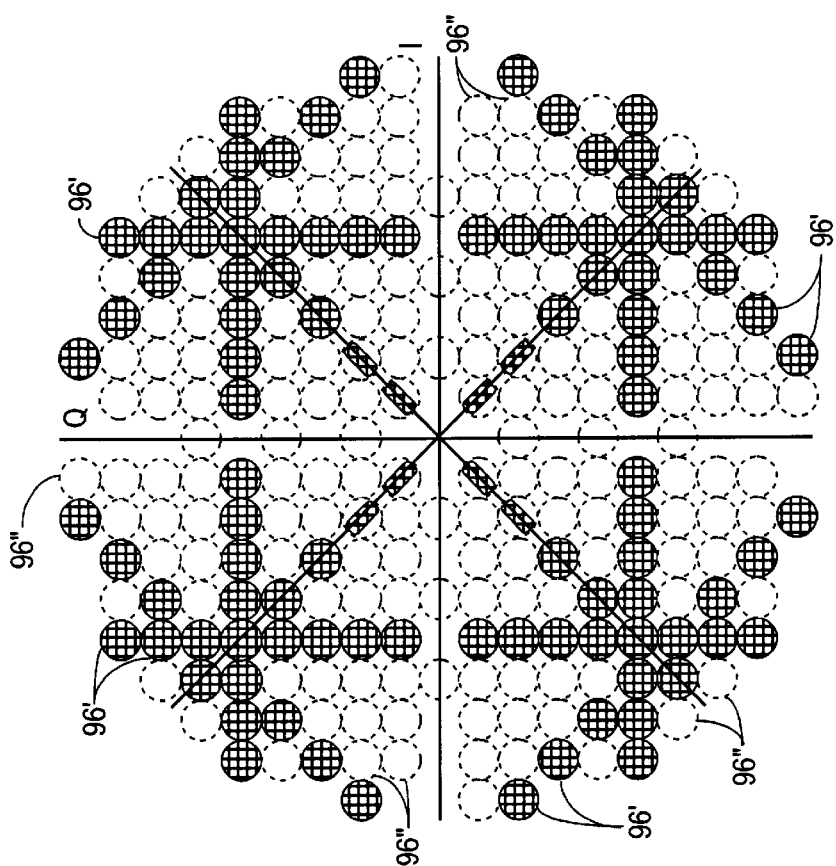
Figure 8:
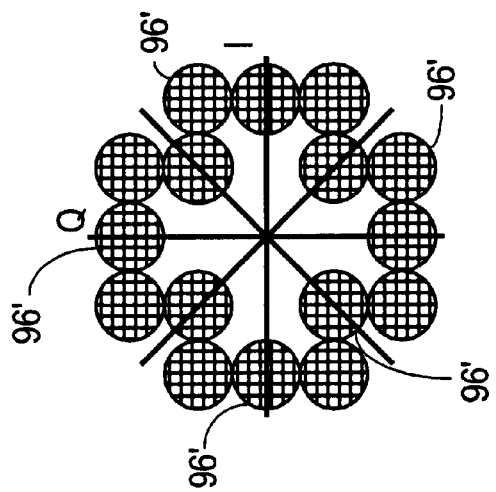
FIGS. 7 and 8 respectively show graphical representations of synchronization masks usable in the demodulator look-up table for the 64-point and 16-point phase constellations of FIGS. 3 and 4.
Figure 7:
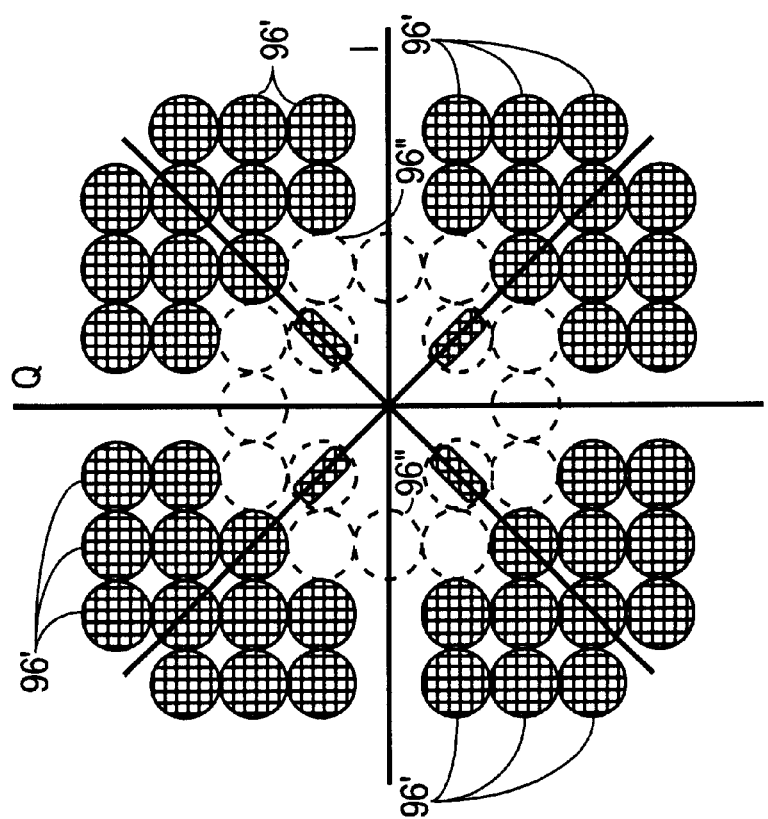

FIGS. 5 and 6 show graphical representations of alternate embodiments of synchronization masks usable in demodulator synchronization look-up table 56 (FIG. 1) for 256-point phase constellation 80 (FIG. 2). FIGS. 7 and 8 respectively show graphical representations of synchronization masks usable in look-up table 56 for 64-point and 16-point phase constellations 80' (FIG. 3) and 80" (FIG. 4).

Referring to FIGS. 5–8, I,Q phase space is shown partitioned into $2^N$ phase point regions 96. For each region 96, a corresponding phase point 84 is provided in the corresponding phase point constellation 80 (FIGS. 2–4). The corresponding phase point 84 would have coordinates substantially at the center of each phase point region 96. Accordingly, regions 96 indicate the portions of phase space from which phase point estimates are likely to be recovered in demodulator 14. If phase point estimates are recovered from within regions 96, the data codes associated with corresponding phase points are likely to be correctly detected.

The gate output of synchronization look-up table 56 (FIG. 1) is programmed so that phase point regions 96 are defined as being either enabled regions. 96', or disabled regions 96". In FIGS. 5–8, enabled regions 96' are illustrated as crosshatched circles while disabled regions 96" are illustrated as dotted-line circles. As graphically illustrated in FIGS. 5–8, look-up table 56 is programmed so that a distinctive pattern of enabled regions 96' emerges. Phase point estimate errors obtained from enabled regions 96' drive the carrier phase acquisition phase locked loop in demodulator 14. Phase point estimate errors obtained from disabled regions 96" do not drive the carrier phase acquisition phase locked loop.

As indicated by the differences between FIGS. 5 and 6, it is anticipated that many different patterns or masks may be programmed into synchronization look-up table 56 to accomplish the same synchronization task for a given constellation 80. Desirably, a pattern is selected that achieves a suitable S-curve for the carrier phase acquisition phase locked loop in demodulator 14.

The selection of a pattern for synchronization look-up table 56 desirably allows the carrier phase acquisition phase locked loop to lock on one of only four phase angles, and those four angles are offset in phase from each other by integer multiples of 90°. The use of phase voids 94 in phase constellations 80 diminishes the likelihood that the phase locked loop will lock at inappropriate angles because the use of phase voids 94 deteriorates the symmetry presented in the intra-quadrant pattern of phase points 84.

In summary, the present invention provides an improved rotationally invariant digital communication system and method. The digital communication system and method described herein achieve full rotational invariance even for higher modulation orders, such as those that use 64 and 256 point constellations. Rotational invariance is achieved at a cost of only a small decrease in basic communication efficiency by the judicious introduction of phase voids into a phase constellation. Moreover, rotational invariance is achieved using a phase point constellation that is suitable for wireless communication. Furthermore, rotational invariance is achieved without requiring differential encoding on convolutionally encoded bits.

Although the preferred embodiments of the present invention have been illustrated and described in detail, it will be readily apparent to those skilled in the art that various modifications and equivalents may be made therein without departing from the spirit of the invention or from the scope of the appended claims. For example, those skilled in the art will understand that the demodulator 14 may use a partially-analog carrier frequency tracking loop rather than the fully digital implementation discussed herein.

What is claimed is:

1. In a digital communication system, a data modulator comprising:

phase map inputs for receiving at least four bits per unit baud interval, said at least four bits including convolutionally encoded bits and non-convolutionally encoded bits;

phase map outputs for providing a set of coordinates of a two-dimensional phase space during each unit baud interval; and a phase mapping circuit coupled between said inputs and said outputs, said phase mapping circuit being configured to implement a phase point constellation having an origin and having phase points collinearly arranged along four diameters of said phase point constellation, wherein a first two of said four diameters intersect at substantially 90°, a second two of said four diameters intersect at substantially 90°, said first two diameters are rotated relative to said second two diameters at substantially 45°, said first two diameters have fewer phase points than said second two diameters, and for each of said phase points there exists, located at substantially the same magnitude and rotated approximately 90° from each phase point, another phase point having an equal data value for said convolutionally encoded bits.

2. A modulator as claimed in claim 1 additionally comprising:
   a parsing circuit configured to provide first and second streams of data;
   a convolutional encoder coupled to said parsing circuit to receive said first stream of data and coupled to a first portion of said phase map inputs to provide said convolutionally encoded bits; and
   a differential encoder coupled to said parsing circuit to receive said second stream of data and coupled to a second portion of said phase map inputs to provide said non-convolutionally encoded bits.

3. A modulator as claimed in claim 2 wherein said first portion of said phase map inputs receives exactly two of said at least four bits per unit baud interval.

4. A modulator as claimed in claim 3 wherein said phase mapping circuit is configured so that said phase points in said constellation are arranged so that:
   a distance between a closest two of said phase points represents one unit;
   all phase points having equal data values for said first portion of said phase map inputs are positioned substantially no less than two units apart; and
   all phase points having mutually inverse data values for said first portion of said phase map inputs are positioned substantially no less than 1.4 units apart.

5. A modulator as claimed in claim 3 wherein said phase mapping circuit is configured so that said phase points in said constellation are arranged so that:
   a distance between a closest two of said phase points represents one unit;
   said first two diameters of said phase point constellation include phase point voids;
   a portion of said phase point voids have positions less than 1.1 units from two phase points having first and second codes for said first portion of said phase map inputs; and
   said portion of said phase point voids have positions less than 1.5 units from two phase points having third and fourth codes for said first portion of said phase map inputs.

6. A modulator as claimed in claim 2 wherein said first portion of said phase map inputs receives exactly two bits per unit baud interval, said second portion of said phase map inputs receives exactly two bits per unit baud interval, and said phase mapping circuit is configured so that:
   phase points having a first code for said first portion of said phase map inputs reside substantially at orthogonal I,Q coordinates of 2,0; 0,2; −2,0; and 0,−2 in said phase point constellation;
   phase points having a second code for said first portion of said phase map inputs reside substantially at orthogonal I,Q coordinates of 2,1; −1,2; −2,−1; and 1,−2 in said phase point constellation;
   phase points having a third code for said first portion of said phase map inputs reside substantially at orthogonal I,Q coordinates of 1,1; −1,1; −1,−1; and 1,−1 in said phase point constellation; and
   phase points having a fourth code for said first portion of said phase map inputs reside substantially at orthogonal I,Q coordinates of 1,2; −2,1; −1,−2; and 2,−1 in said phase point constellation.

7. A modulator as claimed in claim 2 wherein said first portion of said phase map inputs receives exactly two bits per unit baud interval, said second portion of said phase map inputs receives exactly four bits per unit baud interval, and said phase mapping circuit is configured so that:
   phase points having a first code for said first portion of said phase map inputs reside substantially at orthogonal I,Q coordinates of 2,2; 4,2; 2,4; −2,2; −2,4; −4,2; −2,−2; −2,−4; −4,−2; 2,−2; 2,−4; and 4,−2 in said phase point constellation;
   phase points having a second code for said first portion of said phase map inputs reside substantially at orthogonal I,Q coordinates of 2,1; 4,1; 2,3; 4,3; −1,2; −1,4; −3,2; −3,4; −2,−1; −2,−3; −4,−1; −4,−3; 1,−2; 1,−4; 3,−2; and 3,−4 in said phase point constellation; and
   phase points having a third code for said first portion of said phase map inputs reside substantially at orthogonal I,Q coordinates of 1,2; 1,4; 3,2; 3,4; −2,1; −2,3; −4,1; −4,3; −1,−2; −1,−4; −3,−2; −3,−4; 2,−1; 2,−3; 4,−1; and 4,−3 in said phase point constellation.

8. A modulator as claimed in claim 7 wherein said second and third codes are mutually inverse.

9. A modulator as claimed in claim 2 wherein said first portion of said phase map inputs receives exactly two bits per unit baud interval, said second portion of said phase map inputs receives exactly six bits per unit baud interval, and said phase mapping circuit is configured so that:
   phase points having a first code for said first portion of said phase map inputs reside substantially at orthogonal I,Q coordinates of 2,2; 2,4; 2,6; 2,8; 4,2; 4,4; 4,6; 4,8; 6,2; 6,4; 6,6; 8,2; 8,4; −2,2; −2,4; −2,6; −2,8; −4,2; −4,4; −4,6; −4,8; −6,2; −6,4; −6,6; −8,2; −8,4; −2,−2; −2,−4; −2,−6; −2,−8; −4,=2; −4,−4; −4,−6; −4,−8; −6,−2; −6,−4; −6,−6; −8,−2; −8,−4; 2,−2; 2,−4; 2,−6; 2,−8; 4,−2; 4,−4; 4,−6; 4,−8; 6,−2; 6,−4; 6,−6; 8,−2; and 8,−4 in said phase point constellation;
   phase points having a second code for said first portion of said phase map inputs reside substantially at orthogonal I,Q coordinates of 2,1; 2,3; 2,5; 2,7; 2,9; 4,1; 4,3; 4,5; 4,7; 6,1; 6,3; 6,5; 6,7; 8,1; 8,3; 8,5; −1,2; −1,4; −1,6; −1,8; −3,2; −3,4; −3,6; −3,8; −5,2; −5,4; −5,6; −5,8; −7,2; −7,4; −7,6; −9,2; −2,−1; −2,−3; −2,−5; −2,−7; −2,−9; −4,−1; −4,−3; −4,−5; −4,−7; −6,−1; −6,−3; −6,−5; −6,−7; −8,−1; −8,−3; −8,−5; 1,−2 1,−4; 1,−6; 1,−8; 3,−2; 3,−4; 3,−6; 3,−8; 5,−2; 5,−4; 5,−6; 5,−8, 7,−2; 7,−4, 7,−6; and 9,−2 in said phase point constellation; and
   phase points having a third code for said first portion of said phase map inputs reside substantially at orthogonal I,Q coordinates of 1,2; 1,4; 1,6; 1,8; 3,2; 3,4; 3,6; 3,8; 5,2; 5,4; 5,6; 5,8; 7,2; 7,4; 7,6; 9,2; −2,1; −2,3; −2,5; −2,7; −2,9; −4,1; −4,3; −4,5; −4,7; −6,1; −6,3; −6,5; −6,7; −8,1; −8,3; −8,5; −1,−2; −1,−4; −1,−6; −1,−8; −3,−2; −3,−4; −3,−6; −3,−8; −5,−2; −5,−4; −5,−6; −5,−8; −7,−2; −7,−4; −7,−6; −9,−2;,−1; 2,−3; 2,−5; 2,−7; 2,−9; 4,−1; 4,−3; 4,−5; 4,−7; 6,−1; 6,−3; 6,−5; 6,−7; 8,−1; 8,−3; and 8,−5 in said phase point constellation.

10. A modulator as claimed in claim 1 wherein said phase mapping circuit is configured so that said phase points collinearly arranged along said first two diameters are positioned in patterns, said patterns having phase point voids therein.

11. A modulator as claimed in claim 1 wherein said phase mapping circuit is configured so that said phase points in said phase point constellation reside at fewer than all positions less than a magnitude M and located substantially in accordance with the formula:

$$\sum_{I=0}^{M}\sum_{Q=0}^{M} I, Q,$$

where M is a real number and I and Q are integers.

12. A modulator as claimed in claim 11 wherein:
positions within said phase point constellation that are not used as phase points, but are less than said magnitude M and are substantially in accordance with said formula, serve as phase point voids; and
said phase mapping circuit is configured so that a portion of said phase point voids are located on said first two diameters.

13. A modulator as claimed in claim 1 additionally comprising a transmitter coupled to said phase map outputs, said transmitter configured to transmit a digital communication signal responsive to said set of coordinates provided during each unit baud interval via a wireless communication link.

14. A method for rotationally invariant modulation of a digital signal comprising:
receiving at least N to-be communicated bits per unit baud interval at a phase mapper, where N≥four;
translating said to-be communicated bits into coordinates of a two-dimensional phase space in accordance with a constellation of $2^N$ phase points arranged so that:
said constellation has a central origin,
said constellation has phase points collinearly arranged along four diameters of said phase point constellation,
a first two of said four diameters intersect at substantially 90°,
a second two of said four diameters intersect at substantially 90°,
said first two diameters are rotated relative to said second two diameters at substantially 45°,
said first two diameters have fewer phase points than said second two diameters, and
said phase points in said phase point constellation reside at fewer than all positions less than a magnitude M from said origin and located substantially in accordance with the formula:

$$\sum_{I=0}^{M}\sum_{Q=0}^{M} I, Q,$$

where M is a real number and I and Q are integers; and
transmitting a digital communication signal via a wireless communication link, said digital communication signal being configured to exhibit phase states determined in response to said phase point constellation.

15. A method as claimed in claim 14 wherein:
positions within said phase point constellation that are not used as phase points, but are less than said magnitude M and substantially in accordance with said formula, represent phase point voids; and
said translating operation is configured so that a portion of said phase point voids are located on said first two diameters.

16. A method as claimed in claim 14 wherein:
said receiving operation receives a convolutionally encoded stream of data which includes exactly two to-be communicated bits per unit baud interval and a differentially encoded stream of data which includes at least two to-be communicated bits per unit baud interval;
said translating operation is further configured so that said phase points in said constellation are arranged so that:
a distance between a closest two of said phase points represents one unit;
all phase points having equal data values for said two convolutionally encoded bits are positioned substantially no less than two units apart;
all phase points having mutually inverse data values for said two convolutionally encoded bits are positioned substantially no less than 1.4 units apart; and
for each of said phase points there exists, located at substantially the same magnitude as said phase point and rotated approximately 90° from said phase point, another phase point having an equal data value for said two convolutionally encoded bits.

17. A method as claimed in claim 14 wherein said translating operation is configured so that said digital communication signal exhibits phase states determined only in response to said phase point constellation.

18. In a digital communication system, a method for rotationally invariant communication comprising:
receiving a digital communication signal configured in accordance with a phase space having a constellation of at least sixteen phase points each of which phase points is addressed by at least two differentially encoded bits and two convolutionally encoded bits and in which, for each of said phase points, there exists located at substantially the same magnitude as said phase point and rotated in said phase constellation approximately 90° from said phase point, another phase point having an equal data value for said two convolutionally encoded bits;
generating, in response to said digital communication signal, phase error estimates relative to said constellation of at least sixteen phase points;
masking said phase space into an enabled portion and a disabled portion; and
driving a phase locked loop with ones of said phase error estimates obtained from said enabled portion of said phase space.

19. A method as claimed in claim 18 wherein said masking operation is configured so that said enabled portion of said phase space includes fewer than all positions less than a magnitude M from said origin and located substantially in accordance with the formula:

$$\sum_{I=0}^{M}\sum_{Q=0}^{M} I, Q,$$

where M is a real number and I and Q are integers.

20. A method as claimed in claim 19, additionally comprising refraining from driving said phase locked loop with ones of said phase error estimates obtained from said disabled portion of said phase space.

21. A method as claimed in claim 18 wherein said receiving step receives said digital communication signal via a wireless communication link.

* * * * *

UNITED STATES PATENT AND TRADEMARK OFFICE
CERTIFICATE OF CORRECTION

PATENT NO. : 6,392,500 B1
DATED : May 21, 2002
INVENTOR(S) : McCallister et al.

It is certified that error appears in the above-identified patent and that said Letters Patent is hereby corrected as shown below:

Column 10,
Line 46, replace the first occurrence of "5,-5;" with -- 5,-3; --.
Line 47, insert -- coordinates -- after "68".

Column 11,
Line 63, replace "regions." with -- regions --.

Column 14,
Line 32, replace "-4,=2;" with -- -4, -2; --.
Line 55, replace ";," with -- ; 2, --.

Column 16,
Line 58, replace "19," with -- 18 --.

Signed and Sealed this

Tenth Day of September, 2002

Attest:

JAMES E. ROGAN
Attesting Officer   Director of the United States Patent and Trademark Office